Nov. 20, 1962 J. C. MARINACE 3,065,116

VAPOR DEPOSITION OF HEAVILY DOPED SEMICONDUCTOR MATERIAL

Filed Dec. 31, 1959

INVENTOR
JOHN C. MARINACE

BY Alvin J. Riddles
ATTORNEY

United States Patent Office 3,065,116
Patented Nov. 20, 1962

3,065,116
VAPOR DEPOSITION OF HEAVILY DOPED SEMICONDUCTOR MATERIAL

John C. Marinace, Yorktown Heights, N.Y., assignor to International Business Machines Corporation, New York, N.Y., a corporation of New York Filed Dec. 31, 1959, Ser. No. 863,316
6 Claims. (Cl. 148—1.5)

This invention relates to semiconductor bodies formed by the deposition of semiconductor material on a semiconductor substrate, and in particular to the incorporation of high concentrations of conductivity type determining impurities in the semiconductor material deposited.

With the reporting of the phenomenon of quantum mechanical tunneling, by Dr. Leo Esaki in the Physical Review, January 1958, pp. 603–604, the art of the manufacturing of semiconductor devices having a very high concentration of conductivity type determining impurities has been developing. A semiconductor device exhibiting the phenomenon of quantum mechanical tunneling is distinguished by an asymmetric potential current characteristic with a negative resistance in the forward direction. The phenomenon of quantum mechanical tunneling is achieved in a semiconductor device by providing a semiconductor body containing a narrow PN junction with the characteristic that the semiconductor material on both sides of the junction exhibits a property known as degeneracy. The property of degeneracy occurs where the concentration of conductivity type determining impurities is sufficiently high that the "Fermi" level for the semiconductor material falls within the "Valence" band of P-type semiconductor material or the "Conduction" band for N-type semiconductor material instead of in the "Forbidden" region. The concentration of conductivity type determining impurities in semiconductor material is frequently referred to in the art as the doping level of the material.

The doping levels that produce degeneracy have involved such high concentrations of conductivity type determining impurities that the semiconductor crystal tends to reject these impurities and to become polycrystalline. In order to appreciate the actual orders of magnitude involved in these semiconductor properties, and, to establish a proper perspective, the semiconductor material germanium which is one of the more thoroughly investigated materials requires for degeneracy doping levels on the order of $10^{19}$ atoms per cc. and since mono-crystalline germanium contains approximately $10^{22}$ atoms per cc., the doping level to impart the property of degeneracy to the material requires approximately 1 impurity atom for every 1,000 host-crystal atoms. The introduction of such high concentrations of conductivity type determining impurities, without causing the crystal to become polycrystalline, has been very difficult and a reliable, reproducible technique has not been developed at the present stage of the art.

It has been found in the art that superior semiconductor devices may be fabricated by the technique of epitaxial vapor deposition due to the close controllability of the process but that the inclusion in a deposited semiconductor body of sufficient conductivity type determining impurities to produce degeneracy has not been achievable heretofore in the art.

What has been discovered is a technique of vapor deposition, whereby sufficiently high doping levels may be produced in semiconductor materials so that the property of degeneracy in the material is achieved adjacent to PN junctions and the phenomenon of quantum mechanical tunneling may be exhibited from devices having the high doping levels.

It is an object of this invention to provide an improved process for introducing high concentrations of conductivity type determining impurities in a vapor deposition operation.

It is another object of this invention to provide an auxiliary doping source in a vapor deposition process.

Another object of this invention is to provide an improved method of making "Esaki" or "tunnel" diodes.

Still another object of this invention is an improved method of controlling the doping level in semiconductor materials made by vapor deposition.

Still another object of this invention is to provide an improved semiconductor structure.

The foregoing and other objects, features and advantages of the invention will be apparent from the following more particular description of a preferred embodiment of the invention, as illustrated in the accompanying drawings.

The technique of vapor deposition when employed in the fabrication of semiconductor devices involves the formation of a gaseous compound of a transport element and the semiconductor material and the pyrolytic decomposition or disproportionation of that compound to deposit out of the vapor, free semiconductor material on a substrate of the semiconductor material. The deposit is epitaxial with respect to the substrate, in other words, the same periodicity and order of crystal structure existing in the substrate is maintained in the deposited material. This type of deposition has been performed in the art in both closed cycle and open cycle systems. In the closed cycle system the deposition takes place within a sealed container whereas in the open cycle system a constant flow of vapor is provided through a container. The open cycle system has been known in the art as the "open tube" vapor deposition process.

This invention is directed to the open cycle or "open tube" type of vapor deposition process, in which modifications are made to the process in order to achieve the very high doping levels essential to produce degenerate semiconductor materials and simultaneously, to permit better control of the introduction of the conductivity type determining impurities.

One example of a dynamic or open tube vapor deposition process may be found in application Serial No. 815,956, filed May 26, 1959, and assigned to the assignee of this invention.

Figure 1:
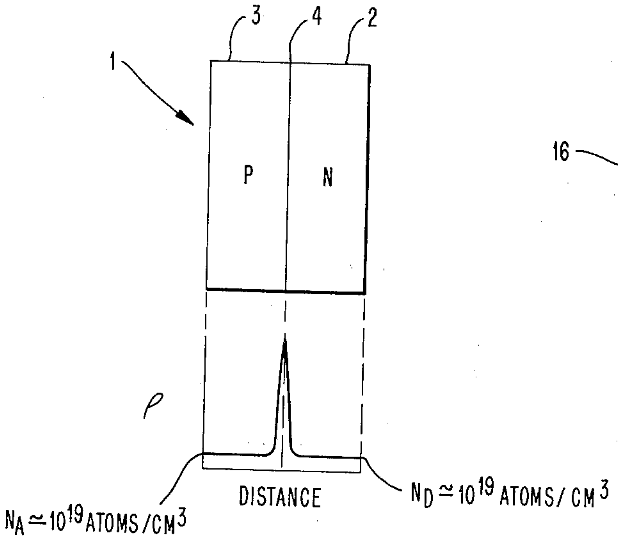
FIG. 1 is a sketch of a semiconductor diode with a dimensionally correlated resistivity diagram showing the high doping level and narrow junction width essential to the phenomenon of quantum mechanical tunneling in semiconductor material.

Referring now to FIG. 1, a sketch is provided of a semiconductor structure 1 having a region of N conductivity type 2 and a region of P conductivity type 3, joined at a PN junction 4. This structure would be the conventional diode known in the art upon the application of ohmic contacts to regions 2 and 3. The structure of FIG. 1 differs from the conventional diode in that the concentration of N conductivity type determining impurities in the region 2 and of P conductivity type determining impurities in the region 3 is sufficiently high that the "Fermi" level for the particular semiconductor material used lies within the "Valence" band or "Conduction" of the semiconductor material for the respective zones. As previously discussed, in the case of germanium semiconductor material, this requirement of concentration is approximately $10^{19}$ atoms per cc. and is of the order of 1 atom for every 1,000 crystal atoms. This requirement is illustrated in FIG. 1 by the dimensionally correlated resistivity plot wherein the resistivity (symbolized $\rho$) is shown extremely low in both regions 2 and 3 and rises sharply to intrinsic at the junction 4 so that a very narrow junction between the highly doped regions is provided.

Figure 2:
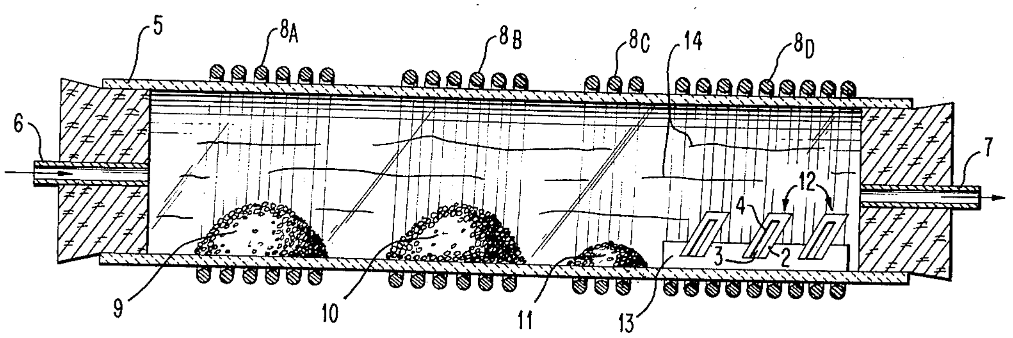
FIG. 2 is a schematic view of an apparatus illustrating the manner of achieving high doping levels in semiconductor material in accordance with the invention.

Referring next to FIG. 2, a view of apparatus capable of performing the invention is shown. The apparatus comprises a refractory environment controlling container shown as a tube 5 having an inlet 6 and an exit 7 for a flow of gas to be later described. Tube 5 is equipped with heat controlling elements shown as windings $8_A$–$8_D$ of, for example, Nichrome or any resistance wire or ribbon through which selective power (not shown) may be applied to control the heat in various zones of the tube 5. The constant flow of gas, which may be a reducing agent such as hydrogen, is provided in the inlet 6 and out the exit 7 during the process of the deposition. Within the tube 5, at the upstream end, a quantity of a transport element 9 is provided. The transport 9 is generally a halogen such as iodine. Downstream from the transport element 9, a source of semiconductor material 10 to be deposited is provided. The source semiconductor material 10 to be deposited is generally polycrystalline for economy, although it may be monocrystalline and in most deposition reactions thus far in the art, the source 10 generally contains the conductivity type determining impurities ultimately desired in the deposited material, however for purposes of producing a range of degenerate semiconductor material, it is found that an additional source of conductivity type determining impurity is essential and this is provided under the heating element $8_C$, downstream from the source of semiconductor material 10 to be deposited and is shown as element 11.

The substrate upon which the deposition is to take place is shown as a plurality of monocrystalline semiconductor material wafers 12 positioned in a fixture 13 which holds them in a position of access to the vapor shown as element 14.

The apparatus of FIG. 2 is shown in an intermediate stage of the deposition process so that the substrate or "seed" wafers 12 have received a deposit and are shown as comprising an original region 3, a PN junction 4, and a deposited region 2 as illustrated in FIG. 1. The original substrate wafers 3 are preferably of degenerate semiconductor material having been previously provided with a sufficient concentration of conductivity type determining impurities to produce the property of degeneracy. This is done to yield a PN junction such as 4 in FIG. 1 by a single deposition of the N type region 2 although it will be apparent that in the light of this description the deposition apparatus may be readily extended to include the deposition of a plurality of different conductivity type zones by adding heat controlled sources of semiconductor material in the tube 5. The elements 12 may be converted into the structure of FIG. 1 by etching away all unnecessary material.

In accordance with the invention, in order to achieve a high concentration of conductivity type determining impurities in an open cycle or open tube vapor deposition system, it is essential that a free source of conductivity type determining impurity be placed in the flow of vapor downstream from the source of semiconductor material to be deposited. This source of impurity is provided by the element 11. In addition, it is desirable in quantum mechanical tunneling types of devices that the PN junction be narrow; that is, that the high doping level be established near the junction as shown in the curve associated with FIG. 1. For this reason it is essential that a minimum of diffusion take place at the junction 4 into the substrate 3 which will serve as the region 2 of FIG. 1. In order to accomplish this, it is essential that the temperature at the substrate 3 in the deposition section under element $8_D$ be maintained at the lowest possible value and still prevent the inclusion of the compound in the deposit. This is achieved in accordance with the invention by controlling the sublimation rate of the transport element 9 to a minimum value consistent with the formation of a useable deposit on the substrate 3 within a reasonable length of time.

A useable deposit may be defined structurally as approximately a 0.002 inch thickness and a reasonable length of time may be considered to be 6 hours.

The sublimation rate of the transport element 9 is influenced by the temperature and the surface area of the element 9 and the flow rate of the gas entering inlet 6 and going out exit 7. For a specific set of values to establish a proper perspective on this point consider the element 9 to be iodine in loosely packed granules in a container not labelled which establishes its dimensions as 1 centimeter in width, 5 inches long. With such an arrangement, at a temperature of from 40 to 50° C., an iodine sublimation rate of 0.075 to 0.15 milligram per hour, per centimeter cross section of the tube will result in an adequate deposition in approximately 6 hours.

While the exact chemical action taking place within the tube 5 has not definitely been established, investigation indicates that where the transport element 9 is iodine and the source semiconductor material 10 is germanium, there is produced a vapor of germanium diiodide ($GeI_2$) which decomposes or disproportionates at a low temperature to form free germanium and germanium tetraiodide ($GeI_4$). With this type of reaction, the substrates 12 in the region under the element $8_D$ of the tube 5 are maintained at the lowest temperature possible without condensation of $GeI_2$ or $GeI_4$ or both. The temperature at the region $8_A$ controls the $I_2$ sublimation rate and is adjusted so that the deposition can be a 0.002 inch thickness in 6 hours. The temperatures of $8_B$ and $8_C$ are sufficiently high to insure that the vapor that reaches the seeds 12 in region $8_D$ is mostly $GeI_2$, and that the vapor contains the impurity.

It has been found in accordance with the invention that through the provision of the independent source of conductivity type determining impurities positioned in the tube downstream of both the source element and the transport element and through the control of the sublimation rate of the transport element that it is possible to achieve sufficiently high doping rates to produce degeneracy at simultaneously sufficiently low deposition temperatures to preclude diffusion from widening a junction so that quantum mechanical tunneling type devices may be produced.

In order to aid in understanding and practicing the invention, the following set of specifications are provided for one skilled in the art, although it should be understood that in the light of the above description many such sets of specifications may be devised.

| | |
|---|---|
| Tube 5 | Quartz (silica), 28 mm. diameter, 36 in. long. |
| Gas 17 | Hydrogen, normal flow rate—2 cu./ft. hr., high flow rate—6 cu. ft./1 hr. |
| Source semiconductor | Germanium, polycrystalline. |
| Material 10 | Powder—100 gms. |
| Substrates 3 | Germanium, monocrystalline, 0.003–0.0002 ohm cm. resistivity. |
| Transport element 9 | Iodine—loosely packed granules, 30–60 gms. |
| Impurity 11 | Phosphorus, 1 gm. |
| Temperature: | |
| Under coil— | |
| $8_A$ | 50° C. |
| $8_B$ | 550° C. |
| $8_C$ | 500° C. |
| $8_D$ | 350° C. |

In the deposition operation, hydrogen is introduced into the tube through the inlet 6 and out the exit 7. After about 10 minutes during which time the reducing effect of the hydrogen purges the tube and its ingredients, the heater windings $8_A$–$8_D$ are supplied with power. Initially, the winding in the region $8_D$ is kept hotter than the others for example in the vicinity of 550° C., and the hydrogen flow rate is kept at 2 or 3 times its normal rate. This operates to etch the substrate wafers 3 to remove any impurities on their surfaces. After about 10 minutes, the hydrogen flow rate is put at its normal value, the source semiconductor 10 region under coil 8*b* is placed at about 550° C. and the substrate region temperature under coil 8*d* is kept as low a temperature as possible without allowing a germanium iodide compound condensation to form in or on the deposition. The temperature of the substrate in the region $8_D$ is dependent to some extent upon the rate of sublimation of iodine; therefore, the temperature of the transport element 9 is kept just high enough, about 50° C. to give a germanium deposition rate of about 8 micro inches per hour, or 0.002 inch in 6 hours.

With the above set of specifications, a deposit such as zone 2 in FIG. 1 of germanium having an impurity concentration sufficient to produce degeneracy and having a thickness of approximately 50 microns may be deposited in a period of 6 hours.

Figure 3:
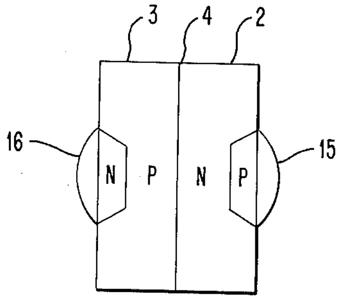
FIG. 3 is a composite semiconductor structure illustrating an application of the technique of the invention.

Referring next to FIG. 3, there is shown a semiconductor device achievable through the technique of this invention. In circuit applications of the "Esaki" or "tunnel" diode, it has been found advantageous to have two such tunnel diodes connected together in series, such a structure is achievable in a single deposition operation in accordance with the invention and is shown in FIG. 3, wherein a degenerate substrate 3 is provided with a deposited, opposite conductivity type degenerate region 2 forming the PN junction 4 as in FIG. 1. With such a structure, to the N region 2 an alloy, P type region 15 is attached employing indium as a conductivity type determining impurity and an alloy, N type region 16 employing tin with arsenic as a conductivity type determining impurity is provded to the region 3. Due to the high doping level characteristic of the recrystallized region in an alloy contact, in such a device, an "Esaki" or "tunnel" diode is formed at the junction between the elements 15 and 2, with the element 15 serving as the anode and the element 2 serving as a cathode and similarly, an "Esaki" or "tunnel" diode is formed at the junction between elements 16 and 3 with 16 serving as the cathode and 3 serving as the anode. The junction 4 also defines an "Esaki" or "tunnel" diode however, the Esaki or tunnel diode due to the extremely high doping levels is essentially an ohmic contact in the reverse direction so that the structure of FIG. 3 made in a single deposition operation with two alloyed junctions is the equivalent of two "Esaki" diodes poled in opposite directions connected to a common point.

What has been described is an improved technique of open cycle or open tube vapor deposition whereby, through the providing of a control on the amount of the transport element, the providing of a free source of conductivity type determining impurity downstream of the source semiconductor material while providing the minimum deposition temperature at the substrate, sufficiently high concentrations of conductivity type determining impurities are introduced in the deposited semi-conductor material to impart the property of degeneracy to the semiconductor material and to permit sufficiently narrow PN junctions between zones of degenerate material to permit the phenomenon of quantum mechanical tunneling in devices. Structures formed as a result of the technique are then useable as "Esaki" or "tunnel" diodes and a unique combination of "Esaki" and "tunnel" diodes in a single structure is provided using as a base the product from the invention.

While the invention has been particularly shown and described with reference to a preferred embodiment thereof, it will be understood by those skilled in the art that various changes in form and details may be made therein without departing from the spirit and scope of the invention.

What is claimed is:

1. In a method of vapor depositing semiconductor material in an open tube system the simultaneous steps of providing an independent temperature controlled free source of a conductivity type determining impurity downstream of the source of semiconductor material to be deposited, the maintaining of the concentration of the transport element in the vapor at a minimum value sufficient for a useable deposit in a six hour period and the maintaining of the substrate at the minimum temperature at which a monocrystalline deposit is achieved.

2. In a method of vapor depositing germanium in an open tube system the simultaneous steps of providing an independent temperature controlled free source of phosphorus downstream from a quantity of germanium to be deposited, the maintaining of a vaporized quantity of iodine below 0.15 milligram per hour per centimeter of cross section of the container employed in said system and the maintaining of a germanium substrate in the vicinity of 350° C.

3. A method for depositing degenerate semiconductor bodies comprising the steps of providing a semiconductor substrate in contact with a moving decomposing vapor of a compound of a transport element and a semiconductor material to be deposited, maintaining the concentration of the transport element in said vapor at a minimum value sufficient for a useable deposit in a six hour period providing an independent temperature controlled free source of a conductivity type determining impurity in contact with said moving vapor downstream of the source of said vapor and maintaining said substrate at the minimum temperature at which a monocrystalline deposit will form.

4. A method for depositing degenerate semiconductor bodies comprising the steps of providing a germanium substrate in contact with a moving decomposing vapor of a compound of a transport element and germanium to be deposited maintaining the concentration of the transport element in said vapor at a minimum value sufficient for a useable deposit in a six hour period providing an independent temperature controlled free source of a conductivity type determining impurity in contact with said moving vapor downstream of the source of said vapor and maintaining said substrate at the minimum temperature at which a monocrystalline deposit will form.

5. A method for depositing degenerate semiconductor bodies comprising the steps of providing a germanium substrate in contact with a moving decomposing vapor of a compound of iodine and germanium to be deposited, maintaining the concentration of the iodine in said vapor at a minimum value sufficient for a useable deposit in a six hour period providing an independent temperature controlled free source of phosphorus in contact with said moving vapor downstream of the source of said vapor and maintaining said substrate at the minimum temperature at which a monocrystalline deposit will form.

6. A method for depositing degenerate semiconductor bodies comprising the steps of providing a germanium substrate in contact with a moving decomposing vapor of a compound of iodine and germanium to be deposited, maintaining the concentration of the iodine in said vapor below 0.15 milligram per hour per centimeter of cross section of the container employed, providing an independent temperature controlled free source of phosphorus in contact with said moving vapor downstream of the source of said vapor and maintaining said substrate in the vicinity of 350° C.

References Cited in the file of this patent

UNITED STATES PATENTS

| | | |
|---|---|---|
| 2,692,839 | Christensen | Oct. 26, 1954 |
| 2,873,222 | Derick | Feb. 10, 1959 |
| 2,898,248 | Silvey | Aug. 4, 1959 |
| 2,910,394 | Scott | Oct. 27, 1959 |